(12) United States Patent
Liu et al.

(10) Patent No.: US 9,689,922 B2
(45) Date of Patent: Jun. 27, 2017

(54) ONLINE DESIGN VALIDATION FOR ELECTRONIC DEVICES

(71) Applicant: Advantest (Singapore) Pte. Ltd., Singapore (SG)

(72) Inventors: Jinlei Liu, Singapore (SG); Zu-liang Zhang, Singapore (SG); Shu Li, Singapore (SG)

(73) Assignee: ADVANTEST CORPORATION, Tokyo (JP)

( * ) Notice: Subject to any disclaimer, the term of this patent is extended or adjusted under 35 U.S.C. 154(b) by 149 days.

(21) Appl. No.: 14/137,518

(22) Filed: Dec. 20, 2013

(65) Prior Publication Data

US 2015/0180618 A1    Jun. 25, 2015

(51) Int. Cl.
*G01R 31/3183* (2006.01)
*G01R 31/317* (2006.01)
*H04L 1/24* (2006.01)

(52) U.S. Cl.
CPC ........ *G01R 31/318307* (2013.01); *G01R 31/31707* (2013.01); *G01R 31/318314* (2013.01); *G01R 31/318335* (2013.01); *G01R 31/318371* (2013.01); *H04L 1/243* (2013.01); *H04L 1/244* (2013.01)

(58) Field of Classification Search
CPC ...... G01R 31/318307; G01R 31/31707; G01R 31/318314; G01R 31/318335
See application file for complete search history.

(56) References Cited

U.S. PATENT DOCUMENTS

| | | | |
|---|---|---|---|
| 6,195,776 B1 * | 2/2001 | Ruiz et al. | 714/738 |
| 6,269,463 B1 * | 7/2001 | Duggirala et al. | 714/738 |
| 6,321,356 B1 * | 11/2001 | Snodgrass | G11C 29/48 714/738 |
| 6,480,979 B1 * | 11/2002 | Tomari | G01R 31/3193 714/718 |
| 6,978,410 B1 * | 12/2005 | Parnas | 714/724 |
| 2003/0084413 A1 * | 5/2003 | Varney | 716/4 |
| 2003/0217343 A1 * | 11/2003 | Rajsuman et al. | 716/4 |
| 2004/0153926 A1 * | 8/2004 | Abdel-Hafez et al. | 714/726 |
| 2004/0153928 A1 * | 8/2004 | Rohrbaugh et al. | 714/738 |
| 2004/0237015 A1 * | 11/2004 | Abdel-Hafez et al. | 714/726 |
| 2005/0262409 A1 * | 11/2005 | Wang et al. | 714/738 |
| 2007/0250570 A1 * | 10/2007 | Van Eyck | 709/204 |
| 2008/0288841 A1 * | 11/2008 | Litten et al. | 714/729 |
| 2011/0078525 A1 * | 3/2011 | Xia et al. | 714/731 |
| 2014/0208177 A1 * | 7/2014 | Parekhji et al. | 714/729 |

* cited by examiner

*Primary Examiner* — Joseph D Torres

(57) ABSTRACT

A computer implemented process is described for testing multiple electronic devices under test (DUTs). A design test pattern or command/instruction is generated with an electronic design automation tool (EDA). The generated design test pattern and command/instruction is sent directly to an automated test equipment apparatus (ATE) over a UNIX or scripting language based, and/or a network based, communication pipeline. The ATE converts the sent design test pattern to an instance of the test pattern directly executable by the ATE. The ATE apparatus inputs test signals to each of the multiple electronic DUTs based on the executable test pattern. The ATE apparatus then receives, from each of the multiple electronic DUTs, a test result based on the input test signals. The ATE returns the received test result, and a report of an action responsive to the command/instruction to the EDA tool, which may then process the test results and report.

17 Claims, 4 Drawing Sheets

Typical Testing Configuration 10
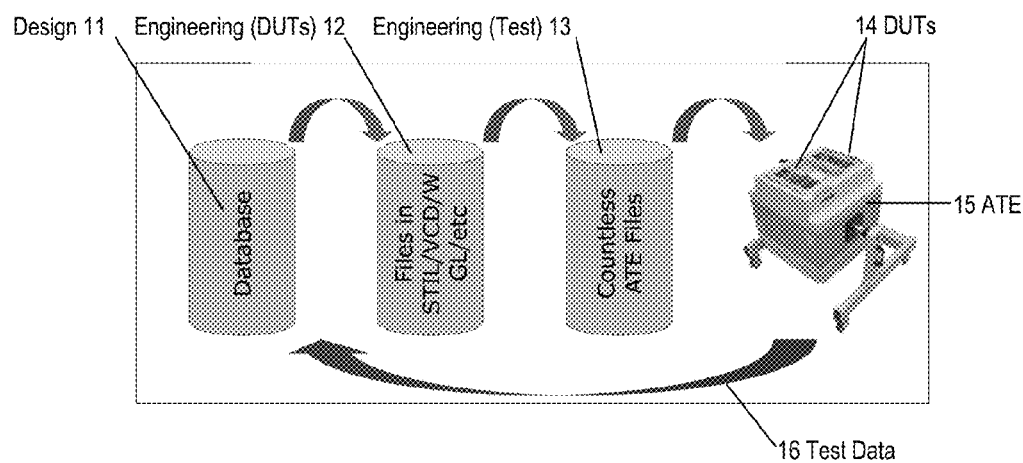
Fig. 1
(Conventional)

ONLINE DESIGN VALIDATION FOR ELECTRONIC DEVICES

TECHNOLOGY

Embodiments of the present invention relate generally to designing and testing electronics devices. More particularly, example embodiments of the present invention relate to systems and methods for validating designs of integrated circuit and other electronic devices.

BACKGROUND

Automated test equipment (ATE) comprises apparatus operable for performing high speed testing on semiconductor devices such as integrated circuit (IC) chips. The testing is conducted to verify that memory, logic and other IC devices function properly during and after their development, fabrication, manufacturing and production processes. During their development, designers, engineers and other artisans skilled in semiconductor technologies use electronic design automation (EDA) and/or simulation tools to generate test patterns, which run on the ATE.

The test patterns comprise specific sequences of data signals, which the ATE input to typically multiple IC devices under test (DUTs). Each of the specific data signal sequences is generated to stimulate or evoke a particular responsive output from the DUTs, which the ATE monitor and evaluate to characterize one or more aspects or features of each DUT. The testing may comprise multiple specially generated test patterns and span multiple iterations, repetitions and/or generations, each with variations of test focus and test patterns based on a design of the DUTs.

For example, developing memory and other IC devices may comprise multiple EDA stages. Initial high level algorithmic and behavioral syntheses may be followed by synthetic translation of abstract logical language into discrete netlists of logic gates and/or memory cells, schematic capture and layout. Device level or "transistor," Boolean level and high level architectural simulation stages, clocking, hardware and in-circuit emulation, computer assisted design (CAD) simulation are then performed, which is followed by analysis, functional verification and operational evaluation.

In developing memory and other IC devices, designers use EDA or simulation tools to generate specific test patterns desired for examining a particular feature, characteristic or behavior of a particular device and store files associated with the generated test patterns in file servers by the design group. At some point, the designers' test patterns stored in the file servers are transferred to engineers within a test engineering group for validation, in which the test patterns proposed and stored by the designers are converted into formats, which may subsequently be read by the ATE.

For example, FIG. 1 depicts a typical pathway 10 for transferring test patterns by a conventional approach. Upon synthesizing a high level behavioral and algorithmic design of memory and other IC devices, designers translate abstract logical language associated with the high level design into a netlist of discrete gates and cells and related schematics, layouts and/or other representations and develop the test patterns for verifying the translated designs. During these stages of development, a variety of EDA related files developed by the designers are typically stored in and accessed from a design database 11 local to the design group.

The files may comprise various formats used in the abstraction and translation of the design. As design development and refinement continues, the volume of data stored in these files grows and may evolve into branches, sequences and versions. To implement the verification of the designs, the EDA related files are typically transferred to an engineering database 12. Engineers may thus confront a large number of files in the various formats exported from the database 11. The file formats may include data written in graphics languages (e.g., GL, GDSII, etc.), source code (e.g., W, etc.), hardware descriptive languages (e.g., Verilog and associated languages such as VCD, VHDL or "VHSIC-HDL," HDL, etc.) and test interface languages such as STIL.

The engineers and associated test technologists access the files stored in the engineering database 12 and may interpret or use these data to compile or generate any number of automated testing or "ATE" files, which can be read by the ATE environment and are stored in a test database 13. An ATE apparatus 15 may be operable for accessing the stored ATE files from the database 13 and programmably controlling or executing a single or series, sequence or group of associated test patterns over multiple like DUTs 14. Upon the ATE 15 executing the test over the DUTs 14, data 16 relating to the test results is returned to the design database 11, where it may be accessed and evaluated to complete one, single iteration.

In the event that everything generated, stored, transferred and converted as discussed above now runs smoothly and according to plans, proposals and expectations, the converted test patterns may then be downloaded to testing hardware components of the ATE, read and executed therewith. Test result data may then be sent for interpretation and evaluation back to the designers, which completes one single iteration for debugging a test pattern and/or the DUTs based thereon. At this point, the conventional process loop for validating an IC design returns to the origin point.

At the origin point with the design group, the process loop for developing the IC device then begins a subsequent iteration. The reiterative character of this conventional approach, requiring both online and offline processes, adds significant latency (days to weeks) and cost to the development process for IC device design and renders the conventional process inefficient and error prone. Moreover, the repetitive sending of test patterns and test results back and forth between various working groups of semiconductor artisans, e.g., across potential network or entity boundaries, presents multiple stages or opportunities from which design security and related intellectual property may be compromised.

Approaches described in this section may, but have not necessarily been conceived or pursued previously. Unless otherwise indicated, approaches mentioned (or issues identified in relation thereto) should not to be assumed as admitted or recognized in any alleged prior art merely by inclusion in this section.

SUMMARY

It would be useful to reduce time, expense and effort of testing for validation of electronic device design implementations. It would also thus be useful to streamline, simplify and smooth the ability of design implementers to test their electronic device design implementations contemporaneous with ongoing development thereof. It would thus further be useful for design implementers to craft test patterns for validating contemporary design developments, which may be executed essentially on-the-fly over multiple electronic devices under test (DUTs).

An example embodiment of the present invention reduces time, expense and effort of testing for validation of electronic device design implementations. An example embodiment also streamlines, simplifies and smoothes the ability of design implementers to test their electronic device design implementations contemporaneous with ongoing developments. Further, an example embodiment allows design implementers to create test patterns for validating contemporary design developments, which may be executed essentially on-the-fly over multiple electronic DUTs.

An example embodiment of the present invention relates to a computer implemented method for testing multiple electronic DUTs. The method comprises generating a design test pattern with an electronic design automation related (EDA) tool, e.g., in a native format thereof. Commands and/or instructions may also thus be sent to the ATE, with which the ATE may be controlled from within the design environment. The generated design test pattern is sent directly to an automated test equipment related (ATE) apparatus over a communication pipeline. The ATE apparatus is operable for the testing the multiple electronic DUTs.

Upon receipt, the ATE executes the design related commands, implements the design related instructions and/or converts the sent design test pattern to a format or an instance of the test pattern directly executable by the ATE apparatus. The ATE apparatus inputs test signals to each of the multiple electronic DUTs based on the executable test pattern. The ATE apparatus then receives, from each of the multiple electronic DUTs, a test result based on the input test signals and returns the received test result to the EDA tool, which may then compute or process an evaluation thereof.

An example embodiment may be implemented in which the communication pipeline comprises a UNIX based channel or operating system supportive of data exchange between computers, including a scripting language such as TCL-TK, Perl, Python or the like. The UNIX based channel may comprise sockets, forks and/or pipes. The communication pipeline may comprise a packet switched network. The packet switched network may comprise a server program operable for directing one or more associated clients to the ATE apparatus and a client program comprising the EDA tool and operable for exchanging data signals with the server.

The server program may comprise multiple interfaces operable for the exchanging the data signals with the client program, in which the ATE apparatus is operable for the converting the sent design test pattern to the executable instance of the test pattern therewith. Upon the receiving a corresponding test result from the plurality of electronic DUTs, the server program is operable for the returning the received test results to the client program.

The operation of the server program or the operation of the client program are relative and interchangeable. Thus, the server program and the client program may electively, optionally and/or freely switch roles.

The creation of the directly executable test pattern may comprise generating one or more of a parameterized or a non-parameterized test pattern on-the-fly based on the exchanging the data signals with the client.

The computer implemented process may further comprise defining a set of rules for an operating system (OS) such as UNIX grammar, grammar associated with a scripting language (e.g., TCL-TK, Perl, Python), and/or a networking protocol (e.g., TCP/IP) for the sending the generated design test pattern and the returning the received test result. The communication pipeline is opened in which the sending and the returning are performed therewith according to the rule sets thus defined.

Sending the generated design test pattern may include compressing the generated design test pattern for transmission efficiency or speed and to conserve bandwidth. The conversion of the sent design test pattern to the format or instance of the test pattern directly executable by the ATE apparatus may thus involve decompressing the compressed design test pattern.

Example embodiments also relate to computer based communication or testing systems, which comprise processors and non-transitory data storage media such as memory, drives, registers, buffers or the like. Further example embodiments also relate to non-transitory data storage media. The non-transitory data storage media comprise instructions tangibly stored therewith which, when executed by one or more computer system processors cause the one or more processors to perform or control the process methods for testing the multiple electronic DUTs).

Thus, an example embodiment of the present invention reduces time, expense and effort of testing for validating electronic device design implementations. An example embodiment also thus streamlines, simplifies and smoothes the ability of design implementers to test their electronic device design implementations contemporaneous with ongoing developments. Further, an example embodiment thus allows design implementers to create test patterns for validating contemporary design developments, which may be executed essentially on-the-fly over multiple electronic DUTs.

BRIEF DESCRIPTION OF THE DRAWINGS

An embodiment of the present invention relates to testing multiple electronic devices. The accompanying drawings below comprise a part of the specification herein of example embodiments of the present invention and are used for explaining features, elements and attributes thereof. Principles of an example embodiment is described in relation to figure (FIG.) of these drawings, in which like numbers are used to reference like items, and in which:

FIG. 1 depicts a typical conventional configuration for test pattern development and application;

Figure 2:
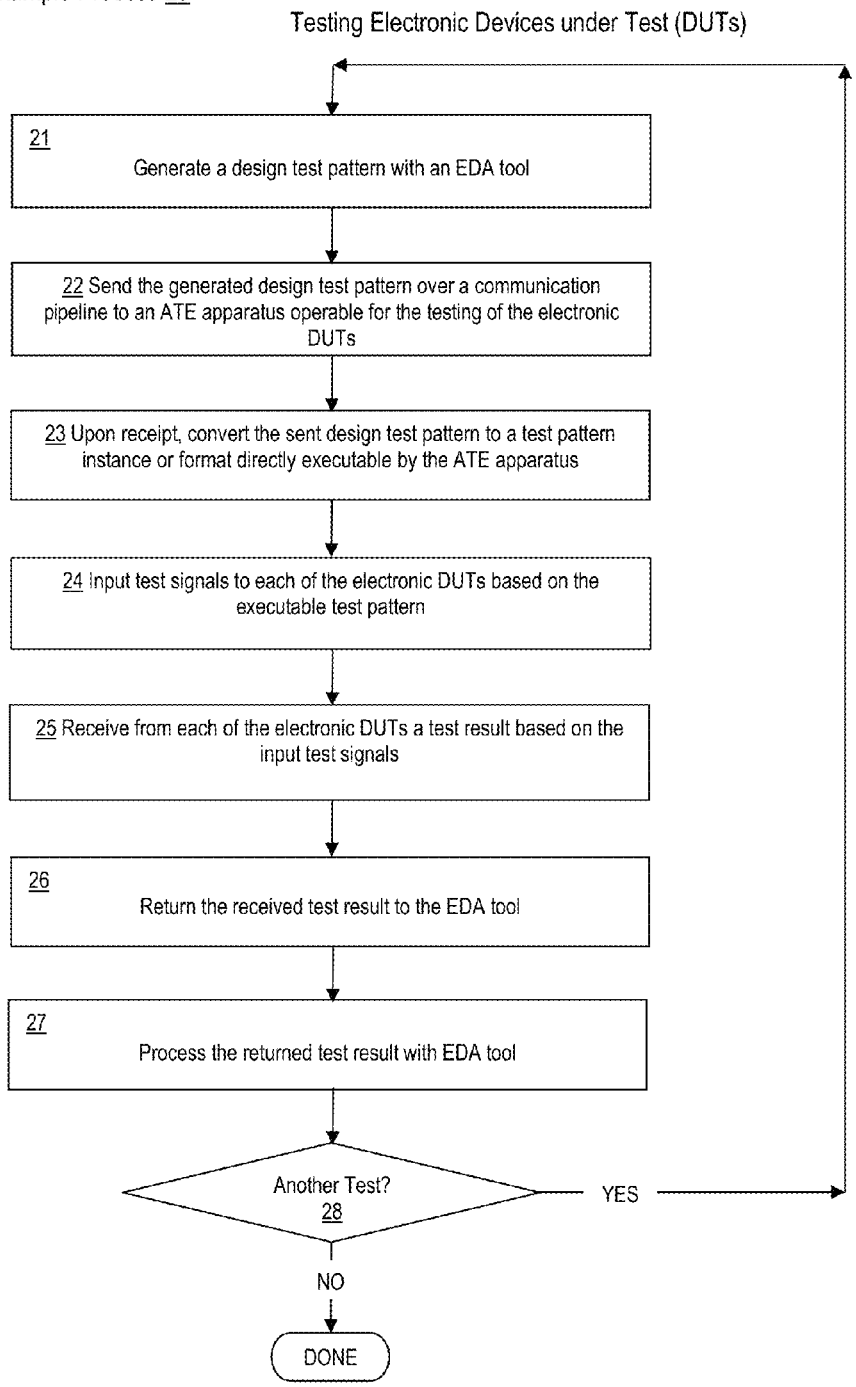
FIG. 2 depicts a flowchart for an example computer controlled test process, according to an embodiment of the present invention

No particular scale applies in these figures (unless stated otherwise herein).

DESCRIPTION OF EXAMPLE EMBODIMENTS

Example embodiments of the present invention are described below in relation to computer implemented methods, communication systems and non-transitory data storage media for testing multiple electronic devices under test (DUTs). The method for instance comprises generating a design test pattern with an electronic design automation (EDA) tool. The generated design test pattern is sent directly to an automated test equipment (ATE) apparatus over a communication pipeline. The ATE apparatus is operable for the testing the multiple electronic DUTs. Upon receipt, the ATE converts the sent design test pattern to a format or an instance of the test pattern directly executable by the ATE apparatus. The ATE apparatus inputs test signals to each of the multiple electronic DUTs based on the executable test pattern. The ATE apparatus then receives, from each of the multiple electronic DUTs, a test result based on the input test signals and returns the received test result to the EDA tool, which may then compute or process an evaluation thereof.

Reference will now be made in detail to implementations of the example embodiments as illustrated in the accompanying drawings. The same reference numbers will be used to the extent possible throughout the drawings and the following description to refer to the same or like items. It should be apparent to artisans of ordinary skill in technologies that relate to testing memory and other semiconductor devices however, that example embodiments of the present invention may be practiced without some of these specifically described details. Example embodiments of the present invention are described in relation to a computer implemented method, communication system and non-transitory data storage media for testing multiple electronic DUTs.

For focus, clarity and brevity, as well as to avoid unnecessarily occluding, obscuring, obstructing or obfuscating features that may be somewhat more germane to, or significant in explaining example embodiments of the present invention, this description may avoid describing some well-known processes, structures, components and devices in exhaustive detail. Artisans of ordinarily skill in technologies related to the design and test of ICs and other electronic devices, and to data communication, should realize that the following description is made for purposes of explanation and illustration and is not intended to be limiting in any way. On the contrary; other embodiments should readily suggest themselves to artisans of such skill in relation to the example features and elements described herein and any corresponding benefits such embodiments may achieve. An example embodiment of the present invention is described in relation to in relation to a computer implemented method, communication system and non-transitory data storage media for testing multiple electronic DUTs.

While embodiments are described herein with reference to example computer implemented methods, communication systems and non-transitory data storage media, it should be appreciated that this is by way of illustration, example, clarity, brevity and simplicity of description. Moreover, artisans of ordinary skill in technologies relating to the design and test of ICs and other electronic devices, and to computer and data communication, should especially appreciate and understand that the scope of embodiments of the present invention thus covers design validation and data communication more generally than described herein and more particularly, to design validation, test and data communication techniques and implementations that are not dissimilar thereto.

An example embodiment of the present invention is described above in relation to a computer implemented method for testing multiple electronic DUTs. The method comprises generating a design test pattern with an EDA tool. The generated design test pattern is sent to an ATE apparatus over a communication pipeline. The ATE apparatus is operable for the testing the multiple electronic DUTs. Upon receipt, the ATE converts the sent design test pattern to a format (or an instance of the test pattern) directly executable by the ATE apparatus. The ATE apparatus inputs test signals to each of the multiple electronic DUTs based on the executable test pattern. The ATE apparatus then receives, from each of the multiple electronic DUTs, a test result based on the input test signals and returns the received test result to the EDA tool, which may then compute or process an evaluation thereof.

Example Processes

FIG. 2 depicts a flowchart for an example computer implemented method for testing multiple (e.g., a plurality of) electronic devices under test (DUTs), according to an embodiment of the present invention. In process step 21, a design test pattern, commands and/or instructions are generated with an electronic design automation related (EDA) tool in a native format thereof.

In process step 22, the generated design test pattern is sent to an automated test equipment related (ATE) apparatus over a communication pipeline. The ATE apparatus is operable for the testing the multiple electronic DUTs. Upon receipt, the ATE apparatus in process step 23 converts the design test pattern and instructions or commands to a format (and/or an instance of the test pattern) that are directly executable by the ATE apparatus.

In process step 24, the ATE inputs test signals to each of the multiple electronic DUTs based on the directly executable test pattern. In process step 25, the ATE apparatus receives from each of the multiple electronic DUTs a test result or output based on the input test signals. In process step 26, the ATE returns and/or a report relating to an action responsive to the command/instruction, to the test result to the EDA tool over the communication pipeline.

Upon receipt, the EDA tool in process step 27 processes the returned test result and reports. For example, the processing may relate to analyzing the returned test results, compiling a failure list or the like, and/or evaluating the electronic DUTs based on the processing of the test results. The processing may also relate to computing parameters or other attributes for further or subsequent testing.

Whether or not to proceed with a subsequent test is decided in process step 28. If no further testing is then selected, the process 20 may terminate. If on the other hand a decision is reached to proceed with further testing, then process method 30 may loop back and repeat, starting with process step 21 and a subsequent design test pattern may then be computed to be sent to the ATE apparatus.

It is appreciated that the communication pipeline may comprise a data channel over which the EDA tool and the ATE apparatus freely exchange data and interact together directly. An example embodiment may be implemented in which the data channel comprises an OS, UNIX or a scripting language (e.g., TCL-TK, Perl, Python) based channel and/or comprises one or more of a socket, a fork and/or a pipe. The communication pipeline may also comprise a network.

An example embodiment may thus be implemented in which the communication pipeline comprises one or more packet switched networks. The packet switched network may be operable according to a protocol such as Transfer Control Protocol/Internet Protocol (TCP/IP) or another set of rules. The packet switched network may comprise a server program operable for directing one or more associated clients to the ATE apparatus. The packet switched network may also comprise a client program, e.g., the EDA tool, operable for exchanging data signals with the server.

The server program comprises multiple interfaces operable for the exchanging the data signals with the client program. The ATE apparatus for example is operable for converting the sent design test pattern to the executable instance or format of the test pattern and testing the multiple electronic DUTs therewith. Upon receiving the test result from the multiple electronic DUTs, the server program is operable for returning of the received test results to the client program, e.g., the EDA tool. The creation of the directly executable test pattern comprises generating one or more of a parameterized or a non-parameterized test pattern on-the-fly (extemporaneously) based on the exchange of the packetized data signals, which comprise the design test pattern with the client EDA tool.

It should be appreciated that an operation of the server program or an operation of the client program are relative or interchangeable. An example embodiment may thus be implemented in which the server program and the client program can selectively, optionally or freely switch roles.

Sending the generated design test pattern may comprise compressing the generated design test pattern. Converting the sent design test pattern to the format or instance of the test pattern directly executable by the ATE apparatus may thus comprise decompressing the compressed design test pattern.

Figure 3:
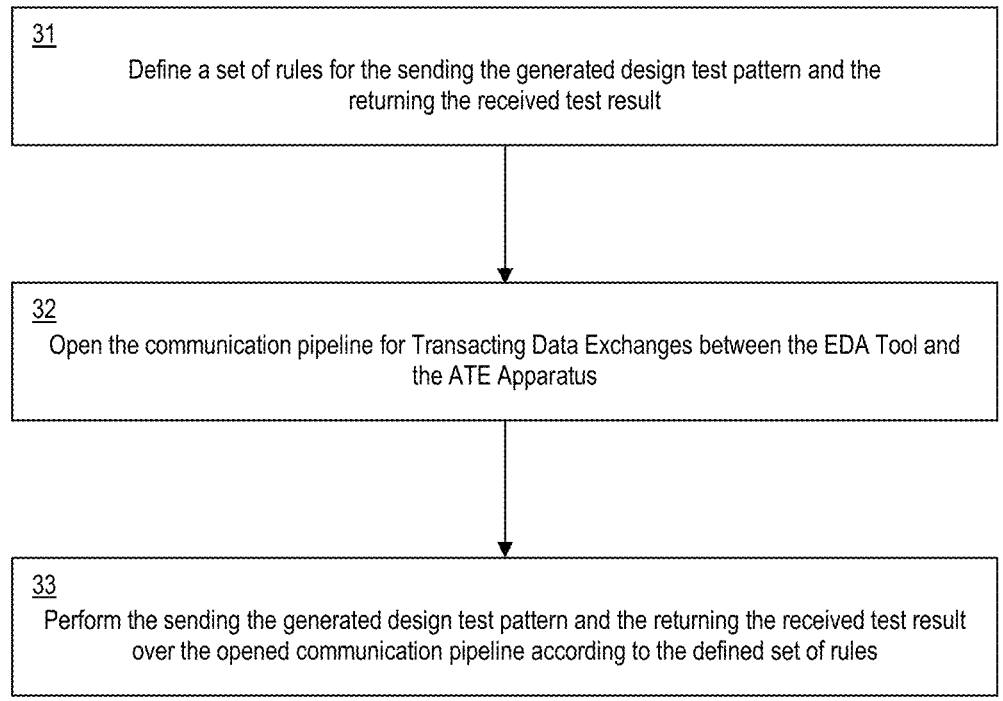
FIG. 3 depicts a flowchart for an example computer controlled test process, according to an embodiment of the present invention.

Data may be exchanged or transacted over the communication pipeline based on one or more protocols, grammars, codes and/or rule sets. FIG. 3 depicts a flowchart for an example computer implemented process method 30, according to an example embodiment of the present invention. In process step 31, a set of rules is defined for sending the generated design test pattern and for returning the received test result over the communication pipeline.

For example, the rule set may comprise rules imposed for efficient and reliable communication using UNIX or a scripting language (e.g., TCL-TK, Perl Python) and the pipeline channel may have sockets, forks and/or pipes. The rule set may prescribe a packet switched network pipeline using TCP/IP, a similar protocol or rule set, or the like.

In process step 32, the communication pipeline is opened. In process step 33, the data exchanges over the communication pipeline between the EDA tool and the ATE apparatus, including sending the design generated test pattern and returning the test results, are performed according to the defined set of rules.

Example System

Figure 4:
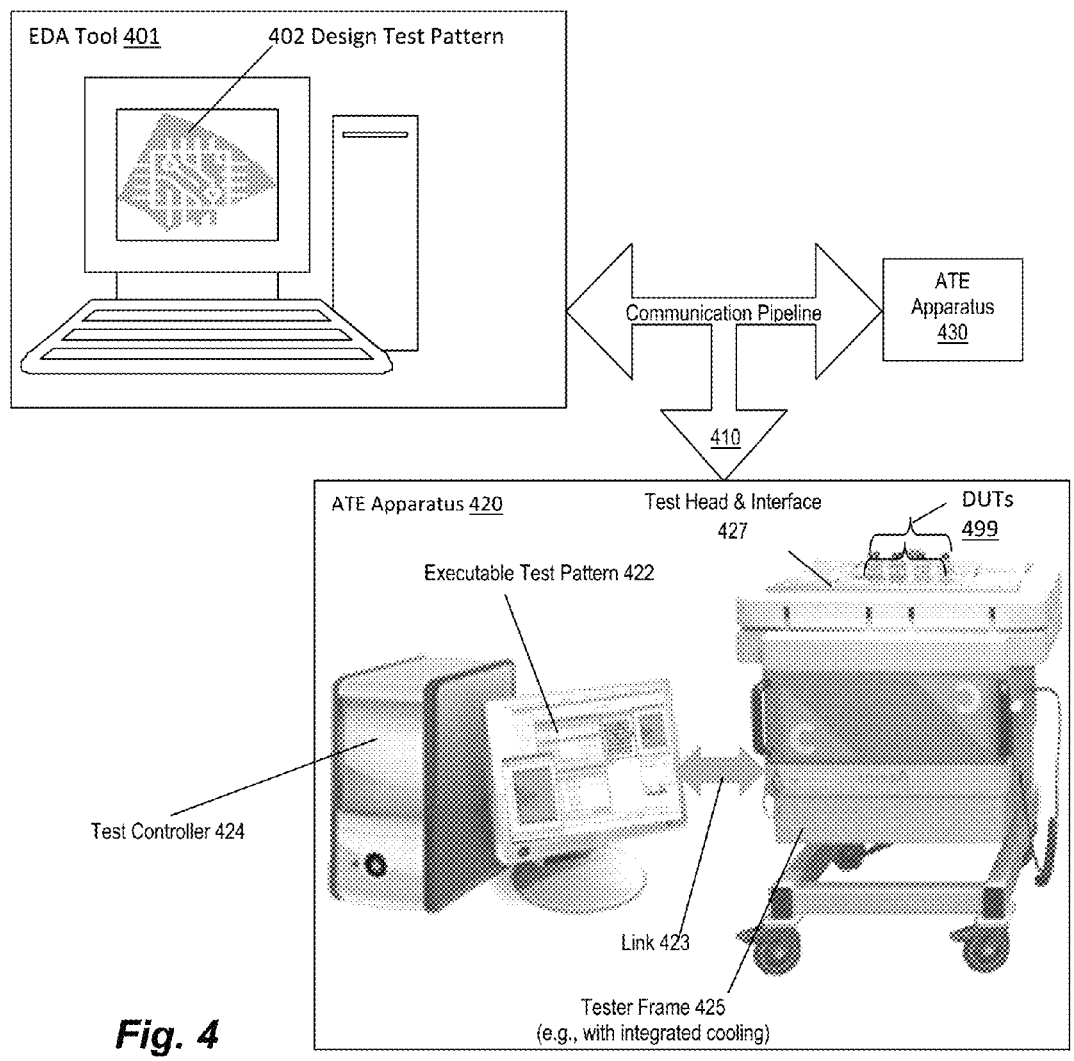
FIG. 4 depicts an example computer based test system, according to an embodiment of the present invention.

FIG. 4 depicts an example computer based communication system 400, according to an embodiment of the present invention. The communication system 400 is operable for testing multiple electronic DUTs.

The system 400 comprises a communication pipeline 410, which has a first end and a second end opposite from the first end. An electronic design automation related (EDA) tool 401 is coupled to the first end of the communication pipeline 410. The EDA tool 401 is operable for computing various design related processes, which include natively generating design test patterns 402 related to the testing multiple DUTs.

An automated test equipment-related (ATE) apparatus 420 is coupled to the second end of the communication pipeline 410. The ATE apparatus 420 is operable for receiving the generated design test pattern 402 from the EDA tool 401 over the communication pipeline 410 and for converting the received design test pattern to a format or an instance of the test pattern 422, which is directly executable with the ATE apparatus 420.

The EDA tool 401 is also operable for generating commands executable by the ATE apparatus 420 and instructions with which the ATE apparatus 420 may be programmed.

An electronic design process may proceed through various, sometimes overlapping stages. For example, an initial or early design stage may involve behavioral and/or algorithmic synthesis. The initial or early synthesis design stage may proceed into a synthetic translation stage, followed more or less respectively by device level architectural simulation, in-circuit emulation, CAD stages and other stages. Implementing each of the various design stages may involve one or more separate design applications. In an example embodiment of the present invention, the EDA tool 401 is operable with the design applications over each of the various stages of the design process using a respectively appropriate application program interface (API). The EDA tool 420 is thus operable for generating test patterns appropriate for validating each of the various design stages and for promulgating commands and instructions that may be executed by the ATE apparatus for testing operability best suited to each design stage.

Another ATE apparatus 430 (which may represent any other number of ATE apparatus) may also be coupled to the communication pipeline at another end, opposite communicatively from the first end. The other ATE apparatus 430 may comprise one or more features, functions or operable attributes that are like, identical, or at least similar to those of ATE apparatus 420.

The ATE apparatus may comprise a test controller component 424. The directly executable test pattern 422 is depicted for example as rendered on a monitor display of the test controller 424. A link 423 provides for communication, data exchange, power supply, control or the like with a tester frame component 425, which may include integrated cooling and/or other features. The tester frame 425 supports a test head and interface 427 with an array of the multiple DUTs 499.

The test head and interface 427 inputs data signals corresponding to the directly executable test pattern 422 to the multiple electronic DUTs 499. The interface and test head 427 receives a test result from the multiple electronic DUTs based on the input directly executable test pattern 422. The ATE apparatus 420 returns the received test result to the EDA tool 401 over the communication pipeline 410. The EDA tool 401 may then process the returned test results.

System 400 may perform one or more computer implemented processing methods such as process 20 and/or process 30 (respectively FIG. 2, FIG. 3). The EDA tool 401, the ATE apparatus 420 and/or one or more components of the communication pipeline 410 comprise processors and non-transitory data storage media such as memory, drives, registers, latches, buffers, addressable transistor memory cells and the like. The non-transitory data storage media comprise instructions tangibly stored and/or encoded therewith which, when executed by the processors, cause the performance and/or the control therewith of one or more computer implemented processing methods such as processes 20 and/or 30.

An example embodiment may be implemented in which the communication pipeline 410 comprises a computer based data channel. The data channel may comprise a UNIX or scripting language (e.g., TCL-TK, Perl, Python) based channel, comprising one or more of sockets, forks, and/or pipes. The communication pipeline may be network based.

An example embodiment may thus be implemented in which the communication pipeline 410 comprises one or more packet switched networks. The packet switched network may comprise a server program operable for directing one or more associated clients to the ATE apparatus. The packet switched network may also comprise a client program, e.g., the EDA tool 401, operable for exchanging data signals with the server.

The server program comprises multiple interfaces operable for the exchanging the data signals with the client program. The ATE apparatus 420 for example is operable for the conversion of the sent design test pattern to the executable instance or format of the test pattern and testing the multiple electronic DUTs 499 therewith. Upon the receiving the test result from the multiple electronic DUTs 499, the server program is operable for the returning of the received test results to the client program, e.g., the EDA tool 402.

It is appreciated that an operation of the server program and an operation of the client program are relative or interchangeable. An example embodiment may thus be implemented in which the server program and the client program can selectively, optionally or freely switch roles.

Creating the directly executable test pattern may involve generating one or more of a parameterized or a non-parameterized test pattern on-the-fly based on the exchange of the packetized data signals, which comprise the design test pattern 402 with the client EDA tool 401.

For transmission efficiency and bandwidth consumption, the EDA tool 401 may compress the generated design test pattern prior to sending the design test pattern to the ATE apparatus 420. The sent design test pattern may be decompressed upon receipt or prior to conversion on-the-fly to the format or instance of the test pattern directly executable by the ATE apparatus.

Thus, an example embodiment of the present invention reduces time, expense and effort of testing for validation of electronic device design implementations. An example embodiment also streamlines, simplifies and smoothes the ability of design implementers to test their electronic device design implementations contemporaneous with ongoing developments. Further, an example embodiment allows design implementers to create test patterns for validating contemporary design developments, which may be executed essentially on-the-fly over multiple electronic DUTs.

An example embodiment of the present invention is thus described in relation to a computer implemented method for testing multiple electronic DUTs. The method comprises generating a design test pattern with an electronic design automation related (EDA) tool, e.g., in a native format thereof. The generated design test pattern is sent directly to an automated test equipment related (ATE) apparatus over a communication pipeline. The ATE apparatus is operable for the testing the multiple electronic DUTs.

Upon receipt, the ATE converts the sent design test pattern to a format or an instance of the test pattern directly executable by the ATE apparatus. The ATE apparatus inputs test signals to each of the multiple electronic DUTs based on the executable test pattern. The ATE apparatus then receives, from each of the multiple electronic DUTs, a test result based on the input test signals and returns the received test result to the EDA tool, which may then compute or process an evaluation thereof.

An example embodiment may be implemented in which the communication pipeline comprises a UNIX or scripting language (e.g., TCL-TK, Perl, Python) based channel or OS. The UNIX or scripting language based channel may comprise sockets, forks and/or pipes. Additionally or alternatively, the communication pipeline comprises a packet switched network. The packet switched network may comprise a server program operable for directing one or more associated clients to the ATE apparatus and a client program comprising the EDA tool and operable for exchanging data signals with the server.

The server program may comprise multiple interfaces operable for the exchanging the data signals with the client program, in which the ATE apparatus is operable for the converting the sent design test pattern to the executable instance of the test pattern therewith. Upon the receiving a corresponding test result from the plurality of electronic DUTs, the server program is operable for the returning the received test results to the client program.

The server program and the client program may electively, optionally and/or freely switch roles.

The creation of the directly executable test pattern may comprise generating one or more of a parameterized or a non-parameterized test pattern on-the-fly based on the exchanging the data signals with the client.

The computer implemented process method may further comprise defining a set of rules such as UNIX grammar and/or a networking protocol (e.g., TCP/IP) for the sending the generated design test pattern and the returning the received test result. The communication pipeline is opened in which the sending and the returning are performed therewith according to the defined rule sets.

The sending of the generated design test pattern may comprise compressing the generated design test pattern for transmission efficiency or speed and to conserve bandwidth. The conversion of the sent design test pattern to the format or instance of the test pattern directly executable by the ATE apparatus may thus comprise decompressing the compressed design test pattern.

Example embodiments also relate to computer based communication or testing systems, which comprise processors and non-transitory data storage media such as memory, drives, registers, buffers or the like. Further example embodiments also relate to non-transitory data storage media. The non-transitory data storage media comprise instructions tangibly stored therewith which, when executed by one or more computer system processors cause the one or more processors to perform or control the process methods for testing the multiple electronic DUTs).

Example embodiments of the present invention transparently, seamlessly and straightforwardly streamlines, simplifies and smoothes the ability of design implementers to test their electronic device design implementations contemporaneous with ongoing developments. The design validation tests are designed and implemented over DUTs, and corresponding test results reported and processed without exposure of device characteristics to compromise during repeated successive intercommunication and iterations, which may protect valuable associated intellectual property.

Moreover, test cases may be brought up and turned around faster and easier as design for testing (DFT) engineering may create and drive test patterns directly onto an ATE apparatus platform and the test patterns may be iteratively fine tuned automatically using batch processing. The latency and complexity of computer aided design (CAD) DFT based test pattern creation for transfer to an ATE apparatus is thus obviated.

Embodiments of the present invention are applicable to design validation with digital, mixed signal, radio frequency (RF), high speed, direct current (DC) and other test cases. The example process methods, systems and data storage media described herein allow frequent validation of design concepts quickly and at low cost. DFT engineering related detection of design flaws or proposal of design improvements may thus occur early in the design flow of electronic devices. Provision of adequate test coverage is improved and high performance test patterns may be efficiently and expeditiously released for test engineering, which may thus create high quality, powerful testing programs.

These features improve the efficiency with which test engineering and design engineering may cooperate in developing electronic devices, which improves engineering resource management efficiency and overall productivity. Example embodiments of the present invention also reduce test time and cost and time to market while simultaneously increasing fault coverage and reducing a risk of releasing devices that may have undetected design flaws, which could otherwise lead to subsequent device reliability issues.

Thus, an example embodiment of the present invention reduces time, expense and effort of testing for validation of electronic device design implementations. An example embodiment also thus streamlines, simplifies and smoothes the ability of design implementers to test their electronic device design implementations contemporaneous with ongoing developments. Further, an example embodiment thus allows design implementers to create test patterns for validating contemporary design developments, which may be executed essentially on-the-fly over multiple electronic DUTs.

Thus, an example embodiment of the present invention is described above in relation to a computer implemented method for testing multiple electronic DUTs. The method comprises generating a design test pattern with an EDA tool. The generated design test pattern is sent directly to an ATE apparatus over a communication pipeline. The ATE apparatus is operable for the testing the multiple electronic DUTs. Upon receipt, the ATE converts the sent design test pattern to a format or an instance of the test pattern directly executable by the ATE apparatus. The ATE apparatus inputs test signals to each of the multiple electronic DUTs based on the executable test pattern. The ATE apparatus then receives, from each of the multiple electronic DUTs, a test result based on the input test signals and returns the received test result to the EDA tool, which may then compute or process an evaluation thereof.

Definitions that are expressly set forth in each or any claim specifically or by way of example herein, for terms contained in relation to features of such claims are intended to govern the meaning of such terms. Thus, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A computer implemented method for testing a plurality of electronic devices under test (DUTs), the method comprising:
generating one or more of a design test pattern, command or instruction with an electronic design automation (EDA) tool in a native format thereof;
sending a generated design test pattern, command or instruction to an automated test equipment (ATE) apparatus over a communication pipeline wherein the ATE apparatus is operable for testing the plurality of electronic DUTs;
upon receipt, the ATE apparatus converting the generated design test pattern, command or instruction to an executable instance of the design test pattern, command or instruction in a format that is directly executable by the ATE apparatus;
inputting one or more of test signals to each of the plurality of electronic DUTs based on the executable instance of the design test pattern, command or instruction;
receiving test results from each of the plurality of electronic DUTs responsive to one or more test signals;
returning received test results to the EDA tool through the communication pipeline and a responsive report of an action of the ATE apparatus, wherein the communication pipeline comprises:

a server program resident on a server and operable for directing one or more associated clients to the ATE apparatus; and
a client program resident on a client comprising the EDA tool and operable to exchange data signals with the server.

2. The computer implemented method as recited in claim 1 wherein the communication pipeline comprises one or more of a UNIX based channel, the UNIX based channel comprising one or more of a socket, a fork and a pipe, and a scripting language based channel.

3. The computer implemented method as recited in claim 1 wherein the server program comprises a plurality of interfaces operable for exchanging the data signals with the client program, wherein the ATE apparatus is operable for converting sent design test pattern to the executable instance of the test pattern therewith and wherein, upon the receiving the test result from the plurality of electronic DUTs, the server program is operable for returning the received test results to the client program.

4. The computer implemented method as recited in claim 1 wherein at least one operation of the server program and at least one operation of the client program are interchangeable.

5. The computer implemented method as recited in claim 1 wherein the converting to the executable instance comprises generating one or more of a parameterized and a non-parameterized test pattern on-the-fly based on the exchanging the data signals with the client.

6. The computer implemented method as recited in claim 1, further comprising:
defining a set of rules for the sending the generated design test pattern and the returning the received test results; and
opening the communication pipeline wherein the sending and the returning are performed therewith according to the set of rules.

7. The computer implemented method as recited in claim 1 wherein the sending the generated design test pattern comprises compressing the generated design test pattern and wherein the converting the generated design test pattern to the executable instance comprises decompressing a compressed design test pattern.

8. The computer implemented method as recited in claim 1 further comprising processing returned test results and the response report by the EDA tool.

9. A system operable for testing a plurality of devices under test (DUTs), the communication system comprising:
a communication pipeline comprising a first end and a second end;
an electronic design automation (EDA) tool coupled to the first end of the communication pipeline and operable for natively generating a design test pattern for testing the plurality of DUTs;
an automated test equipment (ATE) apparatus coupled to the second end of the communication pipeline and operable for:
receiving a generated design test pattern from the EDA tool over the communication pipeline;
converting a received design test pattern to an executable instance of the design test pattern in a format that is directly executable with the ATE apparatus;
inputting the executable instance to the plurality of DUTs;
receiving a test result from the plurality of DUTs, wherein the test result is generated responsive to the inputting the executable instance; and returning a received test result to the EDA tool over the communication pipeline,
wherein the communication pipeline comprises:
a server program resident on a server and operable for directing one or ore associated clients to the ATE apparatus; and
a client program resident on a client and comprising the EDA tool and operable for exchanging data signals with the server.

10. The system as recited in claim 9 wherein the communication pipeline comprises one or more of a UNIX based channel, the UNIX based channel comprising one or more of a socket, a fork and a pipe, and a scripting language based channel.

11. The system as recited in claim 9 wherein the server program comprises a plurality of interfaces operable for exchanging the data signals with the client program, wherein the ATE apparatus is operable for converting the executable instance of the design test pattern therewith and wherein, upon the receiving the test result from the plurality of DUTs, the server is operable for returning the received test results to the client.

12. The system as recited in claim 9 wherein at least one operation of the server program and at least one operation of the client program are interchangeable.

13. A computer-readable non-transitory data storage medium comprising instructions tangibly stored therewith which, when executed by one or more computer system processors, cause the one or more processors to perform or control a method for testing a plurality of devices under test (DUTs), the method comprising:
generating a design test pattern with an electronic design automation (EDA) tool in a native format thereof;
sending a generated design test pattern to an automated test equipment (ATE) apparatus over a communication pipeline, wherein the ATE apparatus is operable for testing the plurality of DUTs;
the ATE apparatus converting the generated design test pattern to an executable instance of the design test pattern directly executable by the ATE apparatus;
inputting the executable instance to each of the plurality of electronic DUTs;
receiving from each of the plurality of electronic DUTs a test result that is generated responsive to the inputting the executable instance;
returning a received test result to the EDA tool,
wherein the communication pipeline comprises:
a server program resident on a server and operable for directing one or more associated clients to the ATE apparatus; and
a client program resident on a client and comprising the EDA tool and operable for exchanging data signals with the server, wherein at least one of an operation of the server program and at least one operation of the client program are interchangeable.

14. The computer-readable non-transitory data storage medium as recited in claim 13 wherein the communication pipeline comprises a UNIX based channel, the UNIX based channel comprising one or more of a socket, a fork and a pipe, and a scripting language based channel.

15. The computer-readable non-transitory data storage medium as recited in claim 13 wherein the server program comprises a plurality of interfaces operable for the exchanging the data signals with the client program, wherein the ATE apparatus is operable for the converting the generated design test pattern to the executable instance of the design test pattern therewith and wherein, upon the receiving the test result from the plurality of DUTs, the server program performs the returning the received test result to the client program.

16. The computer-readable non-transitory data storage medium as recited in claim 13 wherein the converting comprises generating one or more of a parameterized or a non-parameterized test pattern on-the-fly based on exchanging data signals with the client.

17. The computer-readable non-transitory data storage medium as recited in claim 13, wherein the method further comprises:
defining a set of rules for the sending the generated design test pattern and the returning the received test result; and opening the communication pipeline wherein the sending and the returning are performed therewith according to the set of rules.

* * * * *